(12) United States Patent
Hirai

(10) Patent No.: US 7,351,070 B2
(45) Date of Patent: Apr. 1, 2008

(54) MICROCONNECTOR FOR FPC CONNECTION AND METHOD OF PRODUCING THE SAME

(75) Inventor: Yukihiro Hirai, Tokyo (JP)

(73) Assignee: Advanced Systems Japan Inc., Tokyo (JP)

( * ) Notice: Subject to any disclaimer, the term of this patent is extended or adjusted under 35 U.S.C. 154(b) by 245 days.

(21) Appl. No.: 10/541,199

(22) PCT Filed: Dec. 18, 2003

(86) PCT No.: PCT/JP03/16220

§ 371 (c)(1),
(2), (4) Date: Jul. 5, 2005

(87) PCT Pub. No.: WO2004/066690

PCT Pub. Date: Aug. 5, 2004

(65) Prior Publication Data

US 2006/0151210 A1    Jul. 13, 2006

(30) Foreign Application Priority Data

Jan. 23, 2003    (JP) .............................. 2003-014307

(51) Int. Cl.
*H01R 12/00* (2006.01)

(52) U.S. Cl. .................. 439/67; 439/157; 439/495

(58) Field of Classification Search ................ 439/67, 439/69, 77, 78, 329, 495–497, 499
See application file for complete search history.

(56) References Cited

U.S. PATENT DOCUMENTS

| | | | | | |
|---|---|---|---|---|---|
| 3,539,967 | A | * | 11/1970 | Clements | 439/198 |
| 4,824,379 | A | * | 4/1989 | Roberts et al. | 439/77 |
| 5,690,510 | A | * | 11/1997 | Chishima | 439/496 |
| 6,074,220 | A | * | 6/2000 | Roberts | 439/67 |
| 6,733,319 | B1 | * | 5/2004 | Jørgensen | 439/329 |
| 6,764,938 | B2 | * | 7/2004 | Akamatsu et al. | 438/613 |
| 2004/0198906 | A1 | * | 10/2004 | Ding et al. | 524/876 |
| 2006/0151210 | A1 | * | 7/2006 | Hirai | 174/495 |
| 2006/0286858 | A1 | * | 12/2006 | Uchida et al. | 439/495 |

FOREIGN PATENT DOCUMENTS

| | | |
|---|---|---|
| JP | S 63-172061 | 11/1988 |
| JP | 11-339902 | 12/1999 |
| JP | 2000-048885 | 2/2000 |
| JP | 2001-351703 | 12/2001 |

* cited by examiner

*Primary Examiner*—James Harvey
(74) *Attorney, Agent, or Firm*—Berenato, White & Stavish

(57) ABSTRACT

A micro connector comprising an insulator holding a lever, a printed circuit board which has a plurality of micro contacting terminals at a back surface thereof and an FPC cable which has a plurality of micro contacting pieces in an end thereof, wherein said insulator guides said FPC cable.

6 Claims, 7 Drawing Sheets

(a)

(b)

(c)

(a)

(b)

(c)

(a)

(b)

(c)

(d)

(e)

(f)

(a)

(b)

(c)

MICROCONNECTOR FOR FPC CONNECTION AND METHOD OF PRODUCING THE SAME

TECHNICAL FIELD

The present invention relates to a micro connector used for a flexible printed circuit cable (called a FPC micro connector).

BACKGROUND ART

The recent electronic apparatus and equipment have been being developed under the concept of the needs and requirement of "thinner" and "lighter" and the high packing density of electronic components installed in the apparatus and equipment has been attempted. One of the major technologies to realize this high packing density is to use a flexible printed circuit cable (abbreviated as an FPC cable, hereinafter) which has characteristics of flexibility in the installation in various apparatuses and equipment.

Micro connecters to be used for the FPC cables have been enabling cable assembly in curved wiring and three dimensional installation with flexibility such as bending, twisting as well as satisfying the needs and requirements for "thinner" and "lighter" apparatuses and equipment. According to such feature, FPC cables have been adopted in the commercial products such as portable phones that require lightness and thinness as the devices. An example of the FPC micro connectors has been disclosed in the reference 1.

Reference 1:
Japanese laid open patent, 2000-048885

The FIGS. 7A to 7C show cross sectional views of the conventional connector 10. FIG. 7A shows the physical status before an FPC cable 30 is inserted to the connector 10. FIG. 7B shows the status after an FPC cable 30 is inserted to the connector 10 and FIG. 7C shows the status after an FPC cable 30 is clamped by a lever 22 set in the connector 10.

As shown in FIG. 7A, the housing 25 has an opening in the upper portion, side walls 26 in the both sides (a single side in the figure is drawn) and many slits (not shown in the figures) like as gaps between comb teeth. The housing, which is combined in a single unit with the slits to which many contacts 14 like as comb teeth are inserted therein, is attached to the printed circuit board 29.

The contacting piece 17 and the fixing piece 18 of the contact 14 clamps the salient 27 from the upper side and the lower side and the terminal portion 20 of the elastic support 15 of the contact 14 is substantially formed into a column shape. The lever 22 can rotate without interference around the terminal portion 20 which is formed into such substantially column shape at the terminal portion 20 of the elastic support 14. On the upper surface of the contacting piece 17, a contactor portion 19 which electrically contacts with the contacting terminal 31 formed the back surface of the FPC cable 30.

When the lever 22 is rotated in the arrow direction as shown in the FIG. 7B after the FPC cable 30 is set in the predetermined position on the housing 25, the FPC cable 30 is fixed in the physical status that the contacting terminal 31 (see FIG. 6) contacts with the contactor portion 19.

As shown in FIG. 8, the contacting terminals 31 are arranged in a pitch of 0.3 mm on back surface of the FPC cable 30 so that the contacting terminals 31 contact with the contactor portion 19 of the contacting piece 17 of the contact 14. For the manufacturing of the FPC micro connector, high precision press-forming and etching pattern forming have been used and the minimum forming pitch P can be as small as 0.1 mm. The final form of the contacting terminal 31 is rounded at the edges due to the etching process.

However, the quantity of the wires set in the FPC cable tends to increase in accordance with the requirement for the high-speed operation and the high integration of the devices in the recent booming and diffusion of portable telephones with built-in cameras, mobile communication services and internet communication. As the results, there is a problem that conventional FPC micro connectors cannot be accommodated in the limited inner room of the devices such as portable phones.

In order to satisfy the requirements for the application for portable phones, such that highly electrical insulation not to make shortage among wires even for narrowing of the adjacent terminals is maintained and therefore high reliability of terminal contact and high performance portable phones are satisfied, a large capacity FPC micro connector have been desired.

For this purpose, there is a strong demand for ultra-small FPC connectors that support the electronic devices which are in progress to multiple functionalities and high performances, a printed circuit board which has plurality of fine connection terminals and a FPC cable that has a high density contacting terminal.

DISCLOSURE OF THE INVENTION

The present invention is regarding a connector to connect FPC cables to printed circuit boards preferably comprises an insulator holding a lever wherein the insulator guides the FPC cable, a printed circuit board which has a plurality of micro contacting terminals at a back side thereof and an FPC cable which has a plurality of micro contacting pieces in an end thereof.

"High density" implies the pitch P of the contacting terminals are arranged in less than 0.1 mm and a "micro connector" contacting terminals and connecting devices which are aligned in high density.

According to this connector, it is possible to connect the FPC cable direct to the printed circuit board and increase the connection terminals in large extent so that the width of the FPC cable can be shrunk down. The conventional parts which are used for the conventional technologies are not necessary and the height of the whole connector can be shrunk down to a half size of the conventional connector. Therefore, it is possible to provide high density FPC micro connectors.

The contacting terminals of the FPC cable of the connector regarding the present invention are preferred to be directly connected to the contacting terminals formed on the printed circuit board.

In other words, by placing the contacting terminals corresponding to the contacting terminals of the FPC cable on the upper surface of the printed circuit board, the main body of the micro connector comprises two parts as a clumping lever and an insulator so that the half height of the connector body can be realized, the process steps for forming processes and assembly processes are reduced in large extent ultrasmall FPC micro connector can be provided, as well as shortening the electronic circuitry.

For the connector regarding the present invention, the cross sectional shapes of the plurality of the ultra-small contacting terminals formed on the FPC cables is formed in an arch cross sectional shape at the contacting surface.

Since the contacting surface is formed in a formed in arch cross sectional shape, the actual contact portions can be confined at two edges formed in both side edges of the contacting terminal piece. When the contacting terminal is pressed against the other contacting piece, the side edges of the contacting terminals are elastically deformed and cut oxide covering film on the other contacting terminal into the metal surface of the contacting terminal. Therefore the contact is surely performed and the reliability can be twice as much as the conventional contact.

The present invention provides manufacturing method to make plurality of fine contacting terminals on the FPC cable in order to electrically connect the FPC to the printed circuit board. The manufacturing method features to include the first step for the UV lithograph using thick photo resin (or called as "photo resist") as a called photo engraving process and the second step for micro plating process.

According to the present invention which combines the first step to carry out UV lithography the second step to carry out micro plating, it is possible to form ultra small pitches which are not manufactured by the conventional processes. Therefore, the present invention supports the increase of the quantity of the contacting terminals of the FPC cables, which is required by the needs of multiple functionalities to be realized in the electronic devices. The application for radio frequency signal transmission, where the signal lines (SG) and the grand lines (GND) are alternatively arranged, is easily realized by the present invention and high reliability can be obtained.

BRIEF DESCRIPTION OF THE DRAWINGS

FIG. 2 (*b*) is an expanded cut view of the FPC contacting with the printed circuit board along the cut line B-B shown in FIG. 2 (*a*).

FIG. 2(*c*) is an expanded cut view of the FPC contacting with the printed circuit board along the section c shown in FIG. 2(*b*) to show the arched surface of the micro contacting pieces.

FIG. 3(*b*) is a cross sectional view of the physical status after the FPC cable is inserted in the FPC micro connector.

FIG. 3(*c*) is a cross sectional view of the physical status that the FPC cable 7 is inserted in the FPC micro connector regarding the present invention and the FPC cable is pressed by the lever.

FIG. 4(*b*) is the plan view of the FPC cable.

FIG. 4(*c*) is the front view of the FPC cable.

FIG. 4(*d*) is the zoomed-in view of the portion D shown in FIG. 4(*a*).

FIG. 4(*e*) is a plan view of the FPC cable which has contacting terminals in both ends.

FIG. 4(*f*) is the front view of the FPC.

FIG. 7(*c*) is a cross sectional schematic that shows the physical status of the conventional connector when the FPC cable is clamped by the lever attached to the connector.

MODE(S) FOR CARRYING OUT THE INVENTION

We will explain the embodiments of the present invention in referring to the figures.

Figure 1:
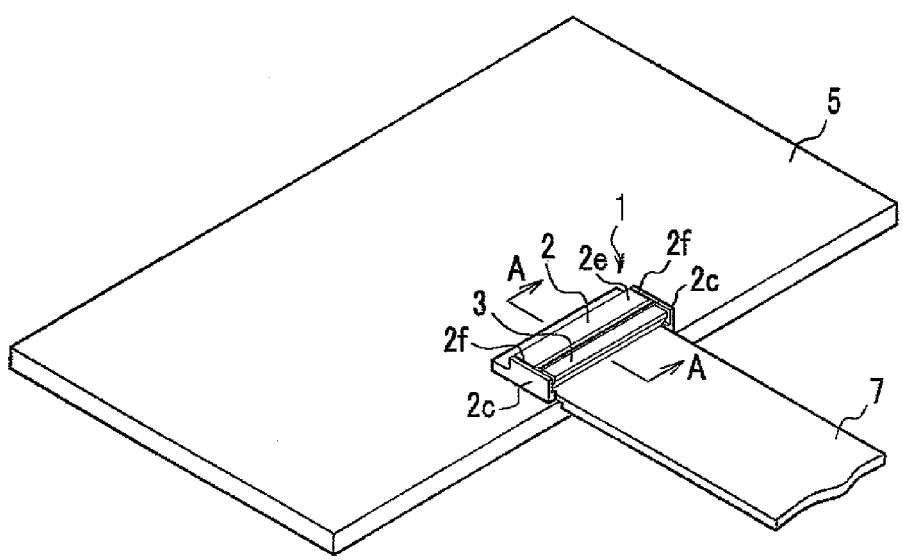
FIG. 1 is a perspective schematic to show the FPC micro connector regarding the present invention.

As shown in FIG. 1, the FPC micro connector 1 comprises an insulator 2, a lever 3 and a printed circuit board 5 which has micro contacting pieces in the back surface thereof and an FPC cable 7 which has a micro contacting terminal 8 at the end and on the back side thereof.

Figure 2:
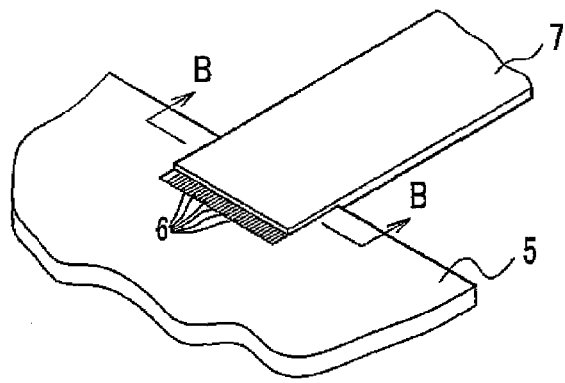
FIG. 2 (*a*) is another perspective schematic to show the physical status wherein the micro connector case is removed from the printed circuit board.
Figure 2:
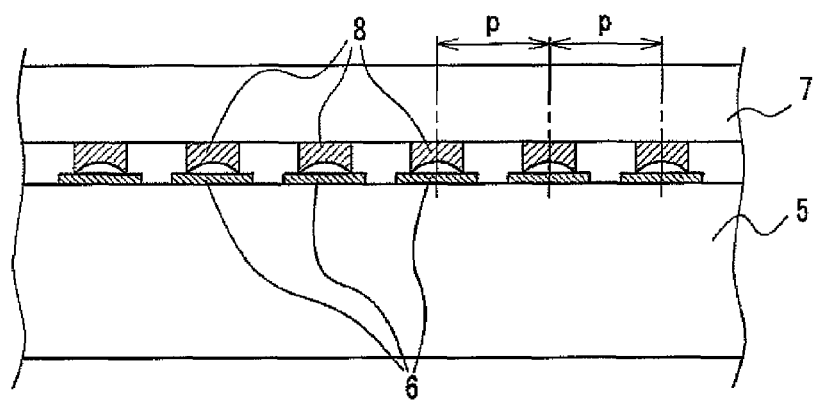
Figure 2:
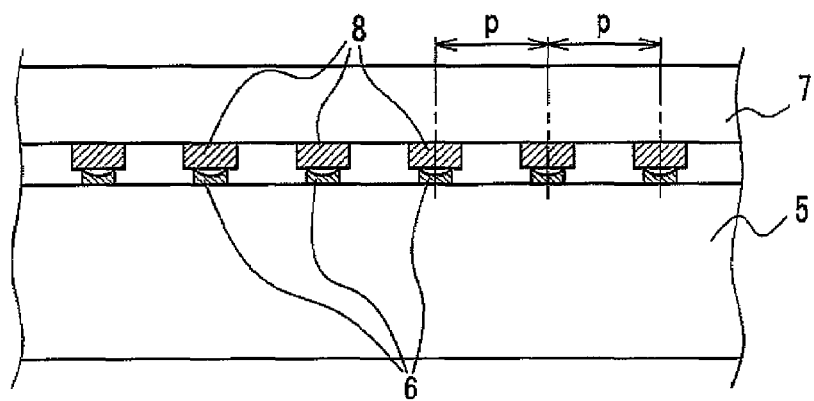

As shown in FIG. 2 (*a*) and FIG. 2 (*b*), the printed circuit board 5 on which electronics parts are soldered and assembled has micro contacting pieces 6 which make the connection pieces separately formed in micro-forming processes. The surfaces of the micro contacting pieces 6 have planner ones. However, the micro contacting terminals 8 formed on the back surface of the FPC cable 7 have an arch cross sectional shape which is in the cross sectional view and the contact of the micro contacting terminal 8 against the micro contacting piece 6 are at the two lines that are the end lines of the edges of the micro contacting terminal 8 at both ends in the widthwise. Since the two end lines of the edges of the micro contacting terminal 8 cut the oxide film or natural oxidation layer covering the micro contacting piece 6 into thereof and firmly contact therewith, the electronic contact between the micro contacting pieces 6 and the micro contacting terminals 8 has high reliability as more than twice against the conventional contact.

As a narrow pitch cabling due to large insulating capability, it is possible to construct a radio frequency transmission circuitry by assigning the lines, which terminate at the micro contacting terminals 8, alternatively for signal line (SG) and the ground lines (GND). By this construction, a high reliable and large line capacity FPC micro connector is obtained even for the pitch between the adjacent contacting terminals is small and therefore applicable to the portable phones for realizing high performances. The pitch between the adjacent contacting terminals is 0.04 mm in the present embodiment.

Insulator

Figure 3:
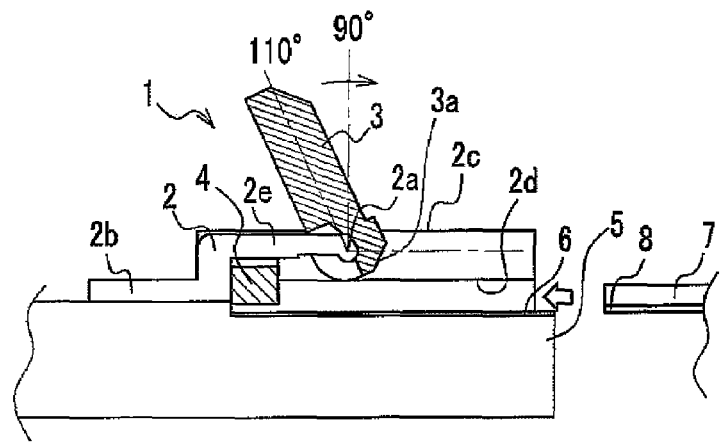
FIG. 3(*a*) is a cross sectional view of the physical status before the FPC cable is inserted in the FPC micro connector.
Figure 3:
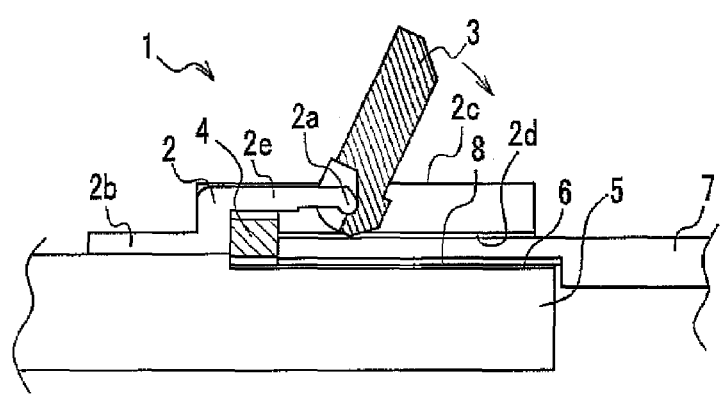
Figure 3:
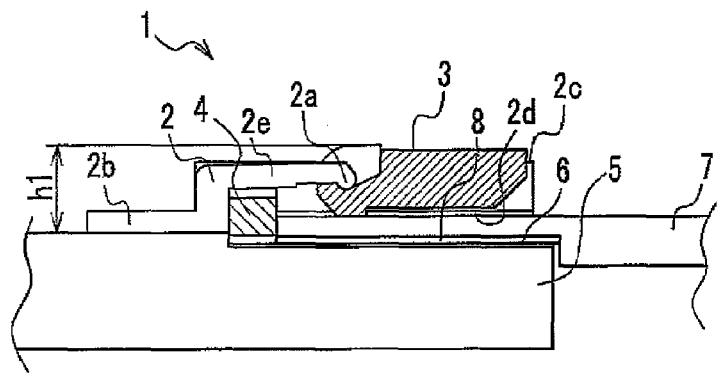

As shown in FIG. 3 (*a*), the insulator 2 guides the FPC cable 7 on the printed circuit board 5 and keeps the FPC cable 7 to the predetermined position so that the micro contacting terminals 8 surely contact with the micro contacting pieces 6 formed on the printed circuit board 5.

The insulator 2 is made of insulating material and constructs the main body of the FPC micro connector.

The physical dimensions of the insulator 2 for the present embodiment are 6 mm depth along the FPC cable 7, 10 mm width along the width of the FPC cable 7 and 0.9 mm height from the printed circuit board 5.

The axial line support 2*a* of the insulator 2 mates the cylindrical recess 3*a* of the lever 3 and maintains the rotational motion of the lever 3 around the axial line support 2*a*. The lever 3 has a part of cam mechanism so that the gap between the outer surface of the lever 3 and the facing surface of the printed circuit board 5 or the micro contacting pieces 6 varies in the rotational angle of the lever 3 and the gap is large enough not to interrupt the insertion of the FPC cable 7 when the lever 3 is pushed up to the release position as shown in FIG. 3 (*a*).

The insulator has a flat base 2*b* in the back side facing to the printed circuit board 5. The flat base 2*b* is fixed to the printed circuit board 5, for example by an adhesive. The insulator 2 has two walls 2*c* along the direction of the insertion of the FPC cable 7 and a groove 2*d* is made for each of the walls 2*c* so that the FPC cable 7 is guided into the insulator 2, which facilitates the positioning of the FPC cable 7 against the height direction (thickness of the FPC cable 7) and width direction and therefore the correct positioning of the FPC cable 7 is feasible in the insertion to the insulator.

Moreover, grooves 2*f* are made between the top flat portion 2*e* and the walls 2*c*, as shown in FIG. 1, so that the lever 3 can elastically push the FPC cable 7 against the printed circuit board 5 by pulling down the lever 3.

Lever 3

The lever 3 is such a small part that the arm length is only 5 mm. The lever 3 is supported by the axial support formed at the end line of the insulator 2 with rotational movable installation. After inserting the FPC cable 7 into the insulator 2 at the predetermined position, the lever 3 can push the micro contacting terminal 8 so that the micro contacting terminal 8 firmly contacts with the micro contacting piece 6 formed on the printed circuit board 5 by means of rotating downwardly the lever 3 of which rotation is done around the axial line support 2*a* so that a part of FPC cable 7 which is exposing to the outside of the insulator 2 connector is covered by the lever 3.

In the present embodiment, the rotation range of the lever 3 is preferably 0 deg. to 110 deg. but can be 0 deg to 90 deg. against the planar surface of the FPC cable 7.

The insulator 2 is fixed to the upper surface of the printed circuit board 5 but does not entirely cover the micro contacting pieces 6 which are to contact to the micro contacting terminals 8 formed on the FPC cable 7 so that some part of the micro contacting pieces 6 are exposing outwardly.

FPC Cable

The FPC cable 7 is explained in the followings.

Figure 4:
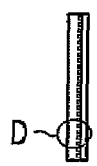
FIG. 4(*a*) is the left hand side schematic of the FPC cable.
Figure 4:
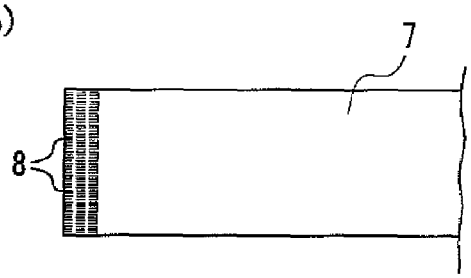
Figure 4:
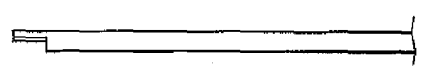
Figure 4:
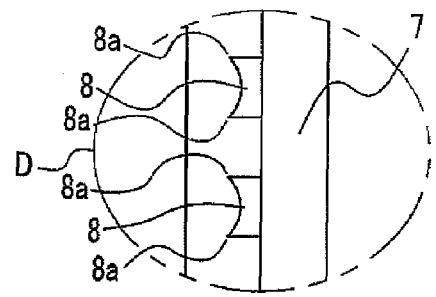
Figure 4:
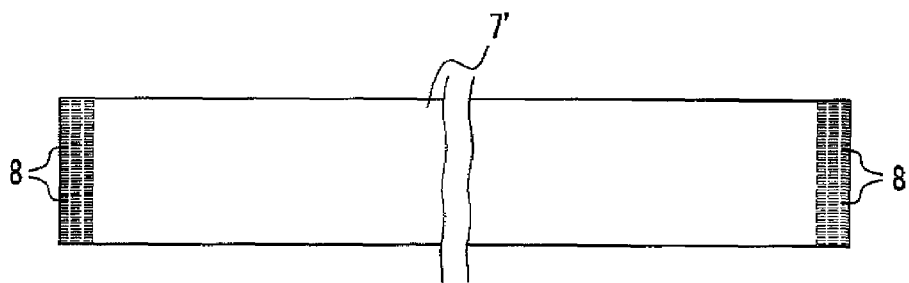
Figure 4:
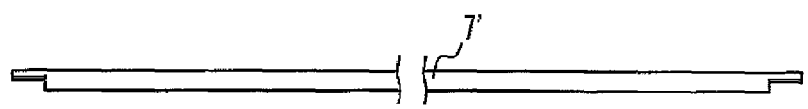

As shown in FIG. 4 (*b*), the FPC cable 7 has a shape of a thin ribbon with 8 mm width. The FPC cable 7 is made of a thin film on which cable lines and circuitries are formed and the other thin film covering thereon and therefore is durable against bending, over lapping, folding and twisting.

As shown in FIG. 4 (*d*), on the back surface of the FPC cable 7, especially at the terminal thereof, the surface of the terminal portion of the FPC cable 7 is facing to the micro contacting piece 6 formed on the printed circuit board 6 has 200 pieces of the micro contacting terminals 8 formed in the predetermined pitch (the pitch P is equal to 0.04 mm (40 micrometers) for the present invention) along the direction of the width of the FPC cable.

Comparing with the conventional flexible flat cable (the pitch is 0.3 mm (300 micrometers)) that has the same width as that of the present FPC cable 7, the conventional flexible flat cable has 25 contacting terminals. However the present embodiment provides 200 pieces of the micro contacting terminals 8 and has been improved as eight times circuit density. Therefore, the width of the connector can be sufficiently narrowed so that further compactization and lightening of the devices is possible.

Micro Contacting Terminals

The micro contacting terminals 8 formed on the FPC cable 7 are facing to the micro contacting pieces 6 and contacting therewith and electrical connection is made between the FPC cable 7 and the printed circuit board 5.

In the present embodiment, the FPC cable 7 that has substantially a ribbon shape is used and the micro contacting terminals 8 have an arch cross sectional shape.

The micro contacting terminals 8 which are formed in the same quantities of the micro contacting pieces 6 to make a one-to-one corresponding connection are arranged on the back surface of the FPC cable 7 in the predetermined pitch in the direction of the width direction of the FPC cable 7 when the electrical contact is made between the FPC cable 7 and the printed circuit board 5.

Figure 5:
FIG. 5 is a perspective schematic that shows the contacting terminals formed on the FPC cable.

As shown in FIG. 4 (*b*) and FIG. 5, the micro contacting terminals 8 have the similar form as that of the micro contacting pieces 6, in other words, substantially a strip shape which has a sufficient length along the length of the FPC cable 7 to obtain satisfactorily electrical contact with the micro contacting pieces 6. The width of the micro contacting terminals 8 is made narrower than that of the micro contacting pieces 6 so that the electrical contact of the micro contacting terminals 8 is surely made with the micro contacting pieces 6.

As shown in FIG. 2 (*b*), FIG. 4 (*d*) and FIG. 5, the micro contacting terminals 8 formed on the surface of the back surface of the FPC cable 7 has an arch shape and the salient edges 8*a* of the micro contacting terminals 8 cut the oxide covering film on the micro contacting pieces 6 terminal into the metal surface thereof.

In other words, the edges of the micro contacting terminals 8 in the width direction form salient edges 8*a*. Therefore, the micro contacting pieces 6 formed on the printed circuit board 5 first contact to the salient edges 8*a* when the lever 3 is pushed downwardly so that the lever 3 rotates around the axial line support 2*a* and the micro contacting terminals 8 formed on the FPC cable 7 is pressed against the micro contacting pieces 6 to make a contact thereto.

Figure 6:
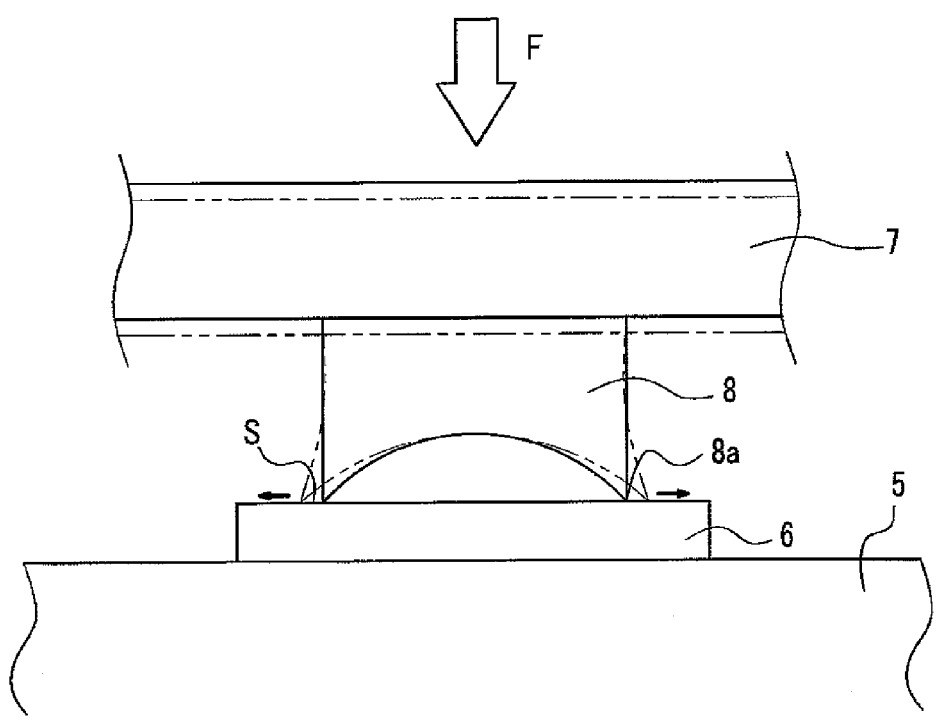
FIG. 6 is an explanatory schematic that shows the contacting terminals on the FPC cables FIG. 7(*a*) is a cross sectional schematic that shows the physical status of the conventional connector before the FPC cable is inserted therein.
Figure 7:
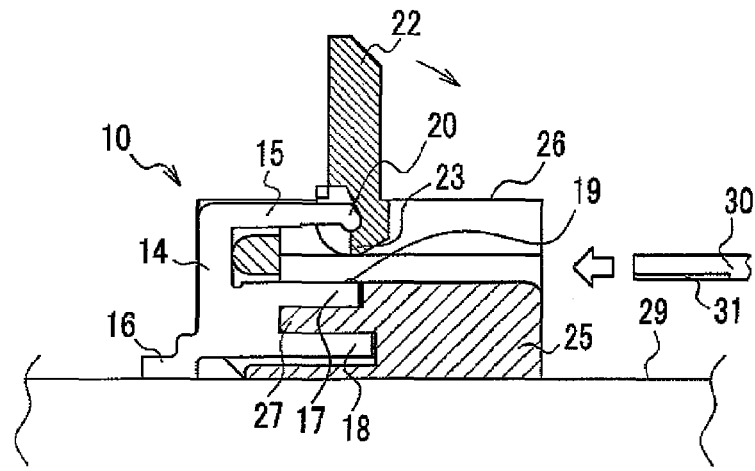
FIG. 7(*b*) is a cross sectional schematic that shows the physical status of the conventional connector when the FPC cable is inserted therein.
Figure 7:
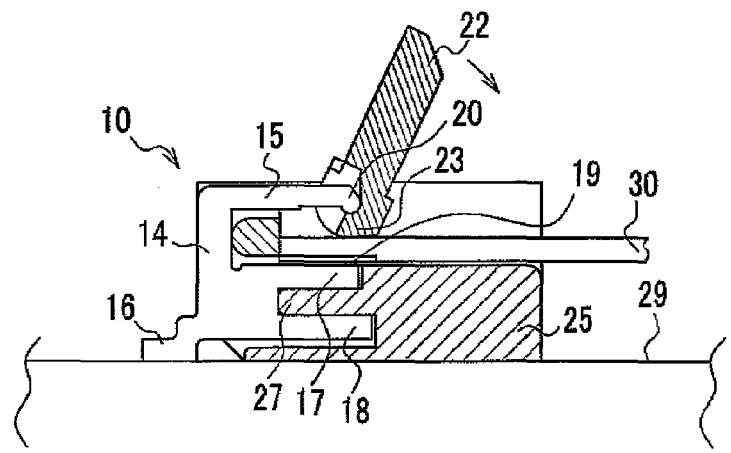
Figure 7:
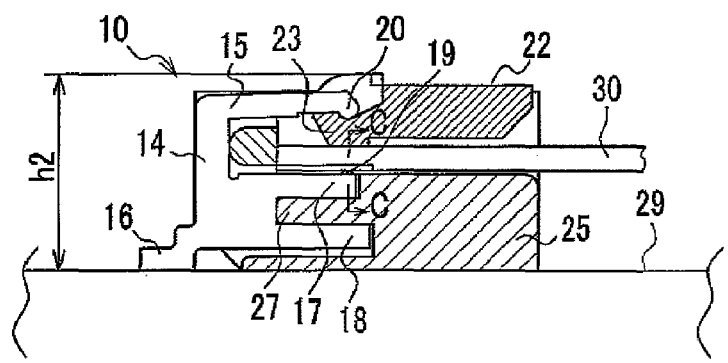

As shown in FIG. 6, when the pressing force F that presses the FPC cable 7 down to the printed circuit board 5 is applied, the salient edges 8*a* of the micro contacting terminals 8 plow the surface of the micro contacting pieces 6 in the direction of the width thereof in slight deformation thereof.

Accordingly, even though oxide layer which baffles the electrical contact is formed on the surface of the micro contacting pieces 6, it is possible to surely obtain an electrical contact between the micro contacting terminals 8 formed on the FPC cable 7 and the micro contacting pieces 6 formed on the printed circuit board 5 because the salient edges formed on the both sides of the micro contracting terminal 6 cut a way the oxide layer covering and existing on the surface of the micro contacting piece 6 when the salient edges 8*a* plow the surfaces of the micro contacting pieces 6.

In other words, the salient edges 8*a* are elastically deformed and plowing the thin oxide layer formed on the micro contacting piece 6 by being pressed against the micro contacting piece 6 by means of the lever as shown in FIG. 3 and therefore the mechanism of the present invention can provide a sure electrical contact as an electrical connector system.

Figure 8:
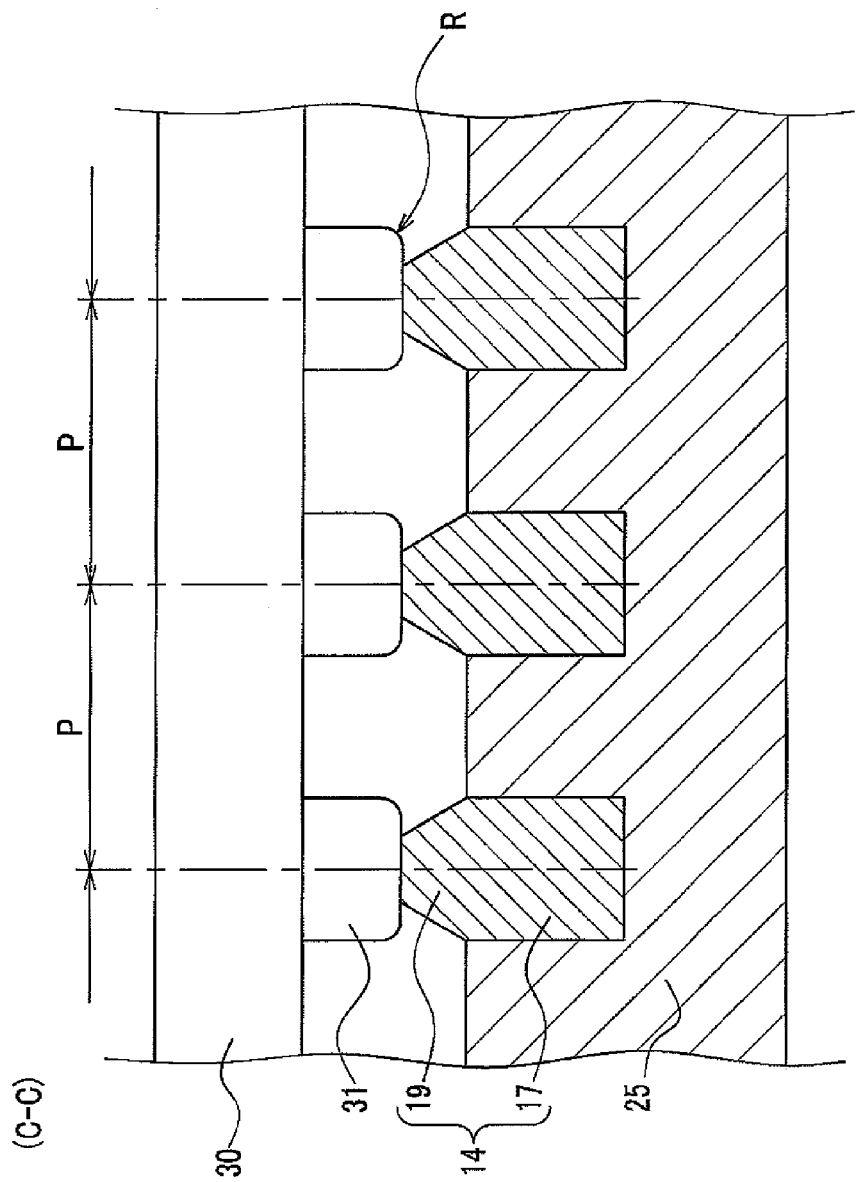
FIG. 8 is a zoomed-in view of the cross section cut in the line C-C.

The micro contacting terminals 8 are preferably formed by an etching process and an additional plating process. When the micro contacting terminals 8 are formed by an etching process, the edge of the micro contacting terminals 8 are rounded during such etching process (refer to "R" shown in FIG. 8 which is a conventional connector system). On the other hand when the micro contacting terminals 8 are processed with an additional plating process, the both edges of the micro contacting terminals 8 grow into the salient edges 8a having a corner angle of 85 to 88 degrees. The contacting surface of the micro contacting terminals 8 becomes to have an arch form.

Contacting Operation of FPC Micro Connector

The operation of the FPC micro connector 1 is explained in reference to FIG. 3.

As shown in FIG. 3 (a), we first rotate the lever 3 of the FPC micro connector 1 up to over the vertical angle (90 degrees) to a declined angle as 110 degrees. The lowest surface of the lever 3 facing to the FPC cable 7 does not contact to the surface of the FPC cable 7 which is inserted into the insulator 2 since the opposite side of the lever 3 has a radius changing in the rotational angle so that a part of an eccentric cam is formed.

As shown in FIG. 3 (b), we insert the FPC cable 7 from the right hand side of FIG. 3 (b) as much as the tip of the FPC cable 7 touches the stopper 4 and then push down the lever 3 which rotates around the axial line support 2a until the lever has been pulled down as shown in FIG. 3 (c). The lowest surface of the lever 3 facing to the FPC cable 7 has come down to have no gap with the FPC cable 7 since the opposite side of the lever 3 has a radius changing in the rotational angle.

In other words, as shown in FIG. 3 (c), it is possible to press the micro contacting terminals 8 on the FPC cable 7 against the micro contacting pieces 6 on the printed circuit 5 and make a sure electrical contact between them by means of the elastic spring force generated by the top flat portion 2e of the insulator 2 when the lever 3 is pulled down and set in horizontal position against the FPC cable 7.

In this setting of the lever 3, the oxide layer existing on the surface of the micro contacting piece 6 is cut a way by the salient edges 8a plowing the surfaces of the micro contacting pieces 6, because the micro contacting terminals 8 have salient edges 8a in both sides. As the result, the micro contacting terminals 8 on the FPC cable 7 makes a sure electrical contact and therefore it is possible to obtain the sufficient electrical connection between them.

Manufacturing Method

The manufacturing method is explained in the followings.

The first step is to carry out UV photo engraving with thick photo resin. This process is to homogenously spread a photo resin on the surface of the cupper foil plated on the cupper foiled board (abbreviated as a board for simplicity) which is to be fabricated as a printed circuit board, bake the board for drying in 90 degree C. temperature and expose ultra-violet light through a photo mask contacted onto the photo resin which is on the board. After exposing with the UV light, the resin is developed to form the pattern that is transferred to the circuit pattern. The transfer is done by the developed resin pattern that blocks the etching. The un-etched portion becomes a pattern of the circuit. This is substantially same micro fabrication process as that used for the present invention.

In stead of coating resin on the board, a photo-sensitive dried film can be used to make the etching pattern. The UV light is ultra-violet light.

The second step is a micro plating deposition process, which is one of the intrinsic properties of plating. As shown in FIG. 4 (d), this is a technology to ultimately form an arch shape in the cross section of the micro contacting terminals 8.

The kind of the plating used in this invention is electrolysis plating. For the primary plating, nickel is plated on the copper foil that is patterned for the circuit. The finishing may be gold plating. For this manufacturing method, the pitch of the micro contacting terminals 8 can be less than 0.1 millimeters or less as less as 40 micrometers and provide a manufacturing method that overcomes the limitation of the conventional micro connectors.

Although there have been disclosed what are the patent embodiment of the invention, it will be understood by person skilled in the art that variations and modifications may be made thereto without departing from the scope of the invention, which is indicated by the appended claims.

For example, we have discussed the FPC cable that has the micro contacting terminals at one end thereof in the previous discussion and it is possible that the FPC cable has the micro contacting terminals at both ends thereof.

We have discussed the micro contacting terminals that have salient edges but it is preferred that the micro contacting pieces on the print circuit boards alternatively have the salient edges.

As we have explained, the micro connector of the present invention can reduce the widths of the FPC cables since the FPC cables are connected to the printed circuit boards by the micro connectors and the quantities of the connections can be largely increased. Alternatively using the conventional connector, the micro connector 1 can provide a half height of the physical dimensions of the connector in comparison to the conventional ones.

According to the setting position of the micro connecting pieces 6 which correspond to the micro connecting terminals 8 formed on the FPC cable, it is possible to provide a ultra small FPC micro connector that has the ultimate height and the steps of fabrication processes and assembly processes can be reduced to be a half height and be extremely shortened, other than to shorten the electrical circuit, since the FPC micro connector consists of the lever and the insulator.

Since the contacting surface of the micro contacting terminals 8 on the FPC cable 7 is curved and two edges of the micro contacting terminals 8 make electrical contact and therefore the reliability can be doubled.

According to the present invention, the electrical metal terminals which have ultra-small pitches can be fabricated by combining the first process that is the conventional UV photo engraving lithography and the second process that is an additional plating process so that the increasing of quantity and the density of the terminals, which is a solution for the multi-function needs, can be provided.

INDUSTRIAL APPLICABIITY

It is possible to facilitate to realize a radio frequency circuit by alternatively placing signal lines and ground lines with highly isolating each other and to apply to various applications.

By alternatively placing signal lines and ground lines with highly isolating each other, high capacity FPC micro connectors, that support high reliable usage, to be used for portable phones can be made even the line spaces are quite small.

The invention claimed is:

1. A micro connector comprising an insulator holding a lever, a printed circuit board which has a plurality of micro contacting pieces at a back surface thereof and an FPC cable which has a plurality of micro contacting terminals in an end thereof, wherein said insulator guides said FPC cable to translate along said printed circuit board to permit the FPC cable to be connected directly to the printed circuit board thereby reducing the size of the micro connector;

wherein at least one of said plurality of micro contacting terminals and said micro contacting pieces has an arch cross sectional shape to define salient contact edges that are adapted to elastically deform when said micro contacting terminals contact said micro contacting pieces.

2. A micro connector according to claim 1, wherein said plurality of micro contacting terminals contact directly to said micro contacting pieces.

3. A micro connector according to claim 2, wherein said plurality of micro contacting pieces has an arch cross sectional shape contacting said micro contacting terminals.

4. A manufacturing method for a micro connector according to claim 1 including a first process for UV lithograph using thick photo resin and a second step for micro plating process.

5. The micro connector according to claim 1, wherein said FPC cable lies directly against said printed circuit board.

6. The micro connector according to claim 1, wherein said insulator comprises sidewall directly engaging said printed circuit board to leave said plurality of micro contacting pieces on the printed circuit board exposed, said FPC cable being inserted between said sidewalls and directly against said printed circuit board.

* * * * *